United States Patent
Watanabe

(10) Patent No.: US 6,355,877 B1
(45) Date of Patent: Mar. 12, 2002

(54) ELECTRONIC DEVICE WITH EXCELLENT SHIELDING AND PRODUCTIVITY

(75) Inventor: Hideki Watanabe, Fukushima-ken (JP)

(73) Assignee: Alps Electric CO LTD, Tokyo (JP)

(*) Notice: Subject to any disclaimer, the term of this patent is extended or adjusted under 35 U.S.C. 154(b) by 0 days.

(21) Appl. No.: 09/537,276

(22) Filed: Mar. 29, 2000

(30) Foreign Application Priority Data

Apr. 2, 1999 (JP) .............................. 11-097075

(51) Int. Cl.[7] .............................. H05K 9/00; H02G 3/08
(52) U.S. Cl. .................... 174/35 R; 174/52.1; 361/816; 361/818
(58) Field of Search ................ 174/52.1, 35 R, 174/35 GC; 361/752, 753, 799, 800, 816, 818; 206/709, 719, 720, 721

(56) References Cited

U.S. PATENT DOCUMENTS

| | | | | |
|---|---|---|---|---|
| 4,092,698 A | * | 5/1978 | Brefka | 361/752 |
| 5,095,177 A | * | 3/1992 | Johnson | 174/35 R |
| 5,436,802 A | * | 7/1995 | Trahan et al. | 361/816 |
| 5,748,449 A | * | 5/1998 | Tahmassebpur | 361/753 |

FOREIGN PATENT DOCUMENTS

JP    10-135664    5/1998

* cited by examiner

*Primary Examiner*—Dean A. Reichard
*Assistant Examiner*—Carmelo Oliva
(74) *Attorney, Agent, or Firm*—Brinks Hofer Gilson & Lione

(57) ABSTRACT

An electronic device with excellent shielding is provided. A case body formed with a metal plate has a side wall, bent with respect to holes formed in a flat plate. The side wall has extruded portions to cover the holes. In comparison with conventional art, radio wave leakage from the holes is reduced.

8 Claims, 3 Drawing Sheets

ELECTRONIC DEVICE WITH EXCELLENT SHIELDING AND PRODUCTIVITY

BACKGROUND OF THE INVENTION

1. Field of the Invention

The present invention relates to an electronic device such as a transmission/reception unit of a cellular phone, a television tuner or the like.

2. Description of Related Art

In a conventional electronic device illustrated in FIG. 7, in a transmission/reception unit of a cellular phone, a cover 11 is used for shielding various electric components mounted on a circuit board.

As shown in FIG. 7, the cover 11 is formed with one metal plate, and has an upper wall 12, a side wall 13 bent downward from the four sides of the upper wall 12, and plural rectangular holes 14 formed on the border between the upper wall 12 and the side wall 13.

Upon formation of the cover 11, first, the plural rectangular holes 14 are formed in four side portions of the flat metal plate so as to facilitate bending.

Next, the four sides of the upper wall 12 are bent at a right angle with respect to one side edge of each hole 14, to form the side wall 13. Thus the cover 11 is completed.

Further, if the cover 11 that covers the electric components is used in an electronic device, as the holes 14 are open, the electric shielding is degraded.

In the conventional electronic device, having the holes 14 on the border between the upper wall 12 and the side wall 13 of the cover 11, as the holes 14 are open, electric shielding is poor.

SUMMARY OF THE INVENTION

The present invention provides, as one means of solving the above problem, an electronic device comprising a case body having a box shape, comprising a metal plate, constituting a frame or a cover, wherein the case body has a side wall bent with respect to a hole provided in a flat plate, and wherein the side wall has an extruded portion to cover the hole.

Further, the present invention provides, as another means of solving the problem, the electronic device having the above construction, wherein the extruded portion, with an edge portion of the hole, extends toward an inner surface side of the flat plate, so as to cover the hole.

Further, the present invention provides, as another means of solving the problem, the electronic device having the above construction, wherein the extruded portion is formed by an extrusion process or drawing process.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

Figure 1:
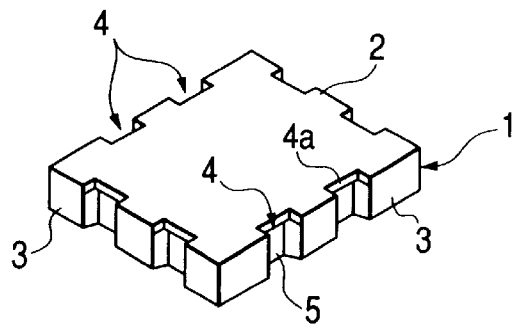
FIG. 1 is a perspective view of a case body of an electronic device according to an embodiment of the present invention.
Figure 2:
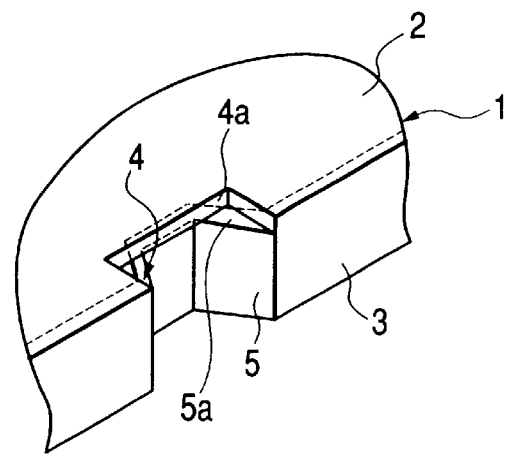
FIG. 2 is an enlarged perspective view of principal parts of the case body of the electronic device according to the embodiment.

First, a case body of an electronic device according to an embodiment of the present invention will be described with reference to FIGS. 1 and 2. A case body 1 having a box shape constitutes a frame or a cover. The case body 1 is formed of one metal plate, and has a flat plate 2 forming an upper wall or the like, a side wall 3 bent downward from four sides of the flat plate 2, plural rectangular holes 4 formed in the flat plate 2 on the border between the flat plate 2 and the side wall 3, and plural extruded portions 5, provided in the side wall 3 so as to extrude toward the hollow side of the case body 1, i.e., inner surface side of the flat plate 2.

The respective extruded portions 5 are extruded, respectively with one edge portion 4a of the hole 4. The extruded portions 5, respectively having an end surface 5a surrounding the hole 4 and in contact with the inner surface of the flat plate 2, cover the holes 4.

Figure 3:
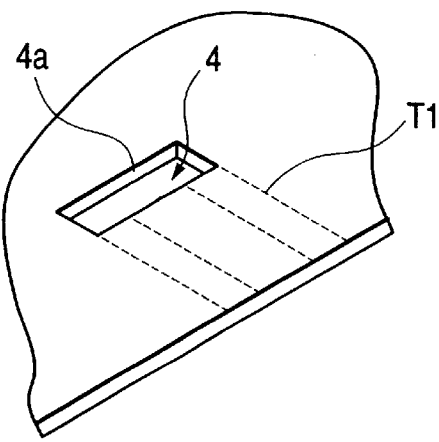
FIGS. 3 to 5 are explanatory views showing manufacture of the case body of the electronic device according to the embodiment.

Upon formation of the case body 1, first, the plural rectangular holes 4 are formed in four side portions of the flat metal plate so as to facilitate bending, as shown in FIG. 3.

Figure 4:
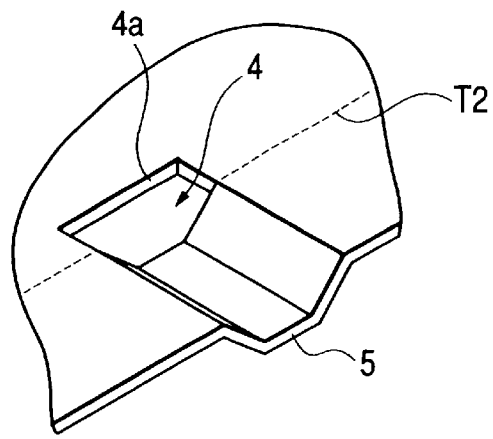
Figure 5:
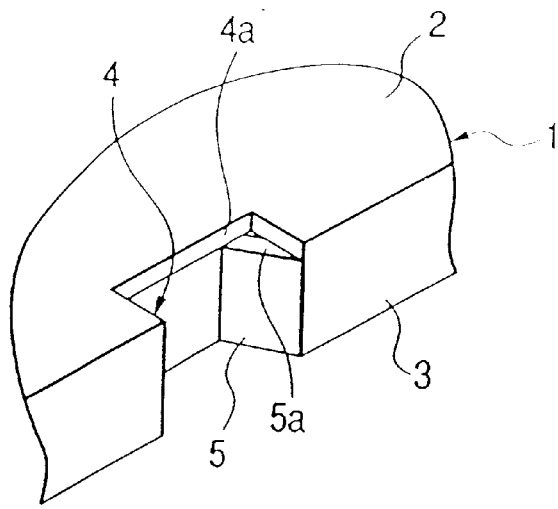

Next, an extrusion process or drawing process is performed in a position represented with dotted lines T1 in FIG. 3, to form the extruded portion 5 having a trapezoidal cross-sectional shape as shown in FIG. 4.

Finally, the flat plate 2 is bent with respect to a position represented with dotted line T2 in FIG. 4, i.e., the end portion 4a of the hole 4. The flat plate 2 and the side wall 3 bent from the four sides of the flat plate 2 are formed, thus the case body 1 is completed.

Further, upon bending, each end surface 5a of the extruded portion 5, surrounding the hole 4, comes into contact with the inner surface of the flat plate 2. Thus the extruded portions 5 cover the respective holes 4.

In a case where the case body 1 which covers electric components is used in the electronic device, as the holes 4 are covered with the extruded portions 5, electric shielding is excellent.

Figure 6B:
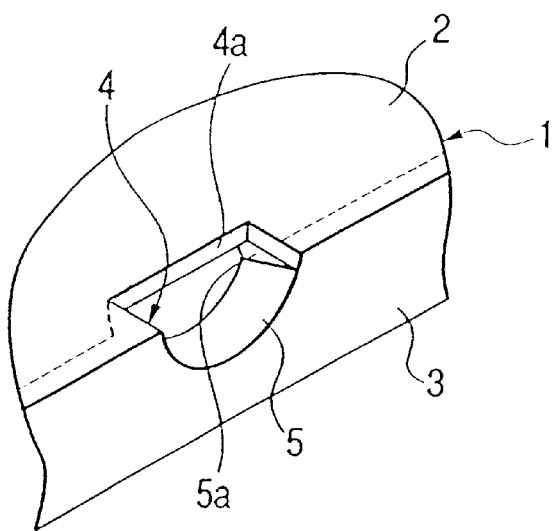
FIGS. 6A and 6B are enlarged perspective views of principal parts of the case body of the electronic device according to another embodiment of the present invention.
Figure 7:
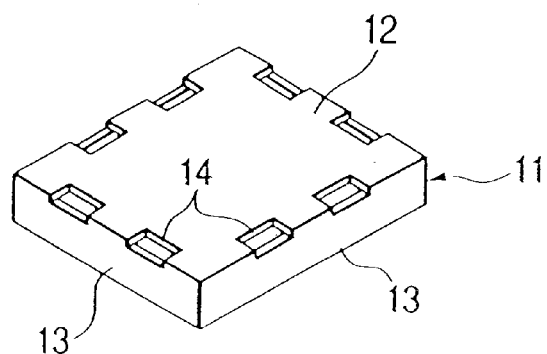
FIG. 7 is a perspective view of a cover of a conventional electronic device.
Figure 6A:
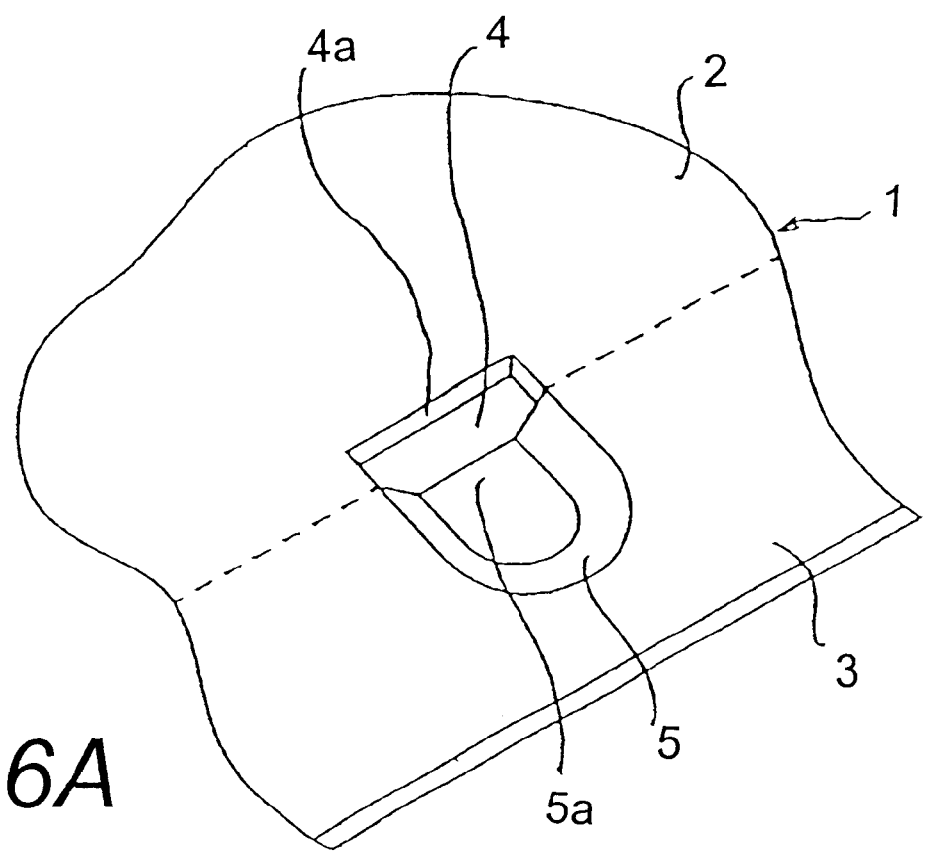

FIG. 6 shows the electronic device according to another embodiment of the present invention. In this embodiment, the extruded portions 5 have a semicircular cross-sectional shape. Each extruded portion 5 is extruded with the end portion 4a of the hole 4, and the end surface 5a, surrounding the hole 4, is in contact with the inner surface of the flat plate 2. Thus the extruded portions 5 cover the respective holes 4.

As described above, in the electronic device of the p resent invention, the case body 1 formed with one metal plate has the side wall 3 bent with respect to the flat plate 2 at the holes 4 of the flat plate 2. The side wall 3 have the extruded portions 5 respectively covering the holes 4. In comparison with the conventional art, radio wave leakage from the holes 4 is reduced, and the shielding is excellent.

Further, each extruded portion 5 is extruded, with the edge portion 4a of the hole 4, toward the inner surface side of the flat plate 2, so as to cover the hole 4. Accordingly, the hole 4 can be covered with the extruded portion 5 at the same time of bending process. Thus, an electronic device with excellent workability and productivity can be provided at a low price.

Further, as the extruded portion 5 is simply formed by extrusion process or drawing process, an electronic device with excellent workability and productivity can be provided.

As many apparently widely different embodiments of the present invention can be made without departing from the spirit and scope thereof, it is to be understood that the invention is not limited to the specific embodiments thereof except as defined in the appended claims.

What is claimed is:

1. An electronic device comprising a case body having a box shape formed from a bent metal plate and constituting one of a frame and a cover, wherein said case body has an upper wall and a side wall bent on all sides of said upper wall, said side wall is bent with respect to a plurality of holes arranged along a bending line formed on said upper wall, wherein said side wall has extruded portions formed at positions corresponding to said holes such that each extruded portion is extruded toward an inner side of the case body, and wherein said extruded portions cover said holes.

2. The electronic device according to claim 1, wherein each of said extruded portions, with an edge portion of each of said holes, extends toward an inner surface side of said upper wall to cover the respective hole.

3. The electronic device according to claim 1, wherein said extruded portions are formed by one of an extrusion process and drawing process.

4. The electronic device according to claim 1, wherein the extruded portions are laterally contiguous with the side walls.

5. The electronic device according to claim 1, wherein each hole abuts only one end surface of the corresponding extruded portion.

6. The electronic device according to claim 1, wherein the extruded portions are in contact with an inner surface of the upper wall.

7. The electronic device according to claim 1, wherein the extruded portions have a substantially rectangular cross-sectional shape.

8. The electronic device according to claim 1, wherein the extruded portions have a substantially semicircular cross-sectional shape.

* * * * *